United States Patent [19]
Wicker et al.

[11] Patent Number: 4,970,483
[45] Date of Patent: Nov. 13, 1990

[54] COIL-LIKE CONDUCTOR OF SINTERED SUPERCONDUCTING OXIDE MATERIAL

[75] Inventors: Alain Wicker, Paris; Alain Février, Maurepas, both of France

[73] Assignee: Societe Anonyme dite:Alsthom, Paris, France

[21] Appl. No.: 319,214

[22] Filed: Mar. 6, 1989

[30] Foreign Application Priority Data

Mar. 7, 1988 [FR] France ................. 88 02851

[51] Int. Cl.$^5$ .............................. H01F 7/22
[52] U.S. Cl. ....................... 335/216; 505/1; 174/154
[58] Field of Search ............. 335/216, 299; 174/15.4, 174/15.5; 505/1

[56] References Cited

U.S. PATENT DOCUMENTS

| 3,561,111 | 2/1971 | Beck et al. ........................ 29/602 |
| 3,763,552 | 10/1973 | Brown et al. ................ 335/216 X |
| 4,494,100 | 11/1985 | Stengel et al. ................... 336/200 |

FOREIGN PATENT DOCUMENTS

| 0170425 | 2/1986 | European Pat. Off. |
| 2035162 | 12/1970 | France. |
| 0058803 | 4/1984 | Japan ............................ 335/216 |
| 0250608 | 12/1985 | Japan ............................ 335/216 |
| 311703 | 12/1988 | Japan ............................ 335/216 |

OTHER PUBLICATIONS

Superconductivity: A Revolution in Electricity is Taking Shape, Chemical & Engineering News, May 11, 1987, pp. 7-16.
Patent Abstracts of Japan, vol. 8, No. 155 (E-25-6)-JP5958803.
Advanced Ceramic Materials-Ceramic Superconductors, vol. 2/#3B/Jul. 1987.
Patent Abstracts of Japan, vol. 8, No. 29 (E-22-6)-JP58191406.
Japanese Journal of Applied Physics.

Primary Examiner—George Harris
Attorney, Agent, or Firm—Sughrue, Mion, Zinn, Macpeak & Seas

[57] ABSTRACT

A coil-like conductor of superconducting material is made from a solid element of sintered superconducting oxide, having a high critical temperature, with the shape of said conductor being imparted thereto by machining the solid element, thus constituting a self-supporting structure.

5 Claims, 2 Drawing Sheets

COIL-LIKE CONDUCTOR OF SINTERED SUPERCONDUCTING OXIDE MATERIAL

The present invention relates to a coil-like conductor superconducting material.

BACKGROUND OF THE INVENTION

Superconducting coils are known that are made from wires based on ductile material, e.g. niobium-titanium. These coils are made by winding, which implies that the wires are capable of being curved without setting up discontinuities (breaks, crack, . . . ) therein.

The discovery of new superconducting materials with a high critical temperature of 30K to 90K unlike the 8K to 15K of niobium-based alloys makes it possible to envisage designing superconducting systems that operate at the temperature of liquid nitrogen (77K), rather than at the temperature of liquid helium (4.2K). These new materials are ceramic type compounds: La Ba Cu O, La Sr Cu O, Y Ba Cu O. Like any other ceramic, the behavior of these materials is brittle, i.e. they break with practically no deformation. It is therefore not easy to make wires out of these materials. In addition, deforming such wires without breaking electrical continuity is a very chancy undertaking.

A particular aim of the present invention is to provide coil-like conductors made of non-ductile superconducting material and which are easier to make than known coils.

SUMMARY OF THE INVENTION

The present invention povides a coil-like conductor of superconducting material made from a solid element of sintered superconducting oxide, having a high critical temperature, with the shape of said conductor being imparted thereto by machining said solid element, and thus constituting a self-supporting structure.

The term "superconducting oxide" is used to cover any superconducting material comprising one or more oxide type phases.

In a first embodiment, saoid solid element is in the form of a hollow cylinder which is subsequently cut to form a solenoid.

In a second embodiment, said solid element is in the shape of a rectangular plate which is subsequently cut to form a flat coil.

In a third embodiment, said solid element is in the form of two hollow half-cylinders which are subsequently cut to form the two portions of a dipole.

These examples are given purely by way of illustration.

Any appropriate machining method may be used: mechanical cutting tols, electro-erosion, laser machining, . . . .

BRIEF DESCRIPTION OF THE DRAWINGS

Embodiments of the invention are described by way of example with reference to the accompanying drawings, in which.

DETAILED DESCRIPTION

In order to make the variants shown in the figures, the following starting materials are used: $Y_2O_3$, $BaCO_3$, $CuO$, mixed in appropriate proportions. The compound $YBa_2Cu_3O_7$ is obtained after heat treatment in air at 1000° C., and this compound has a critical temperature of 91K. Such a method is described, for example, by M. K. Wu et al, in an article published in Phys. Rev. Lett. 5B (1987) 90B.

The resulting powder is ground in a liquid medium so as to obtain a mean grain diameter lying in the range 0.5 $\mu$m to 2 $\mu$m.

Figure 1:
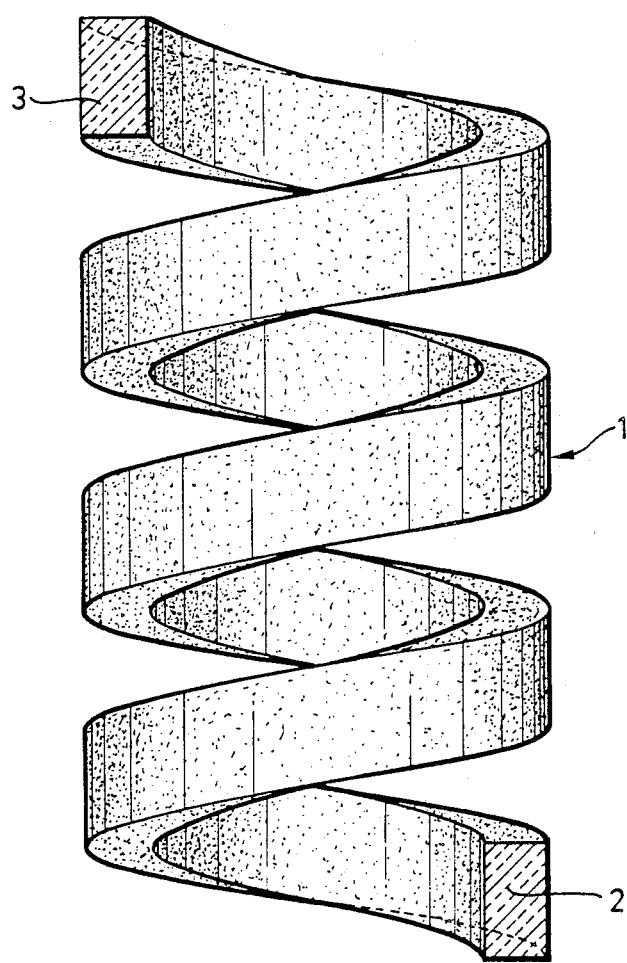
FIG. 1 is a diagrammatic perspective view of a solenoid in accordance with the invention.

In order to obtain the solenoid 1 in accordance with the invention as shown in FIG. 1, the above powder is taken and isostatically compressed under a pressure of about 2 tonnes per $cm^2$ (where "tonne" means metric ton) in order to make a cylinder having the following dimensions:

outside diameter: 38 mm
inside diameter: 30 mm
length: 250 mm

After sintering in oxygen at 970° C. for one hour, a hollow cylinder is obtained having the following dimensions:

outside diameter: 32.6 mm
inside diameter: 25.5 mm
length: 213 mm

The cylinder is cut, e.g. using a diamond-impregnated circular saw, to obtain a helix 1 whose pitch is such that the width of the tape 3 is 14 mm so as to leave a section 2 with a current-passing area of about 50 $mm^2$.

This provides a self-supporting structure having ten to twelve turns, and the resulting equivalent conductor length is about 1 meter.

Naturally, the solenoid described is a laboratory model. A geometrically similar example to the above could be designed for use in machinery. It would also be possible to design a second solenoid disposed around the first.

These coils are intended to be used, in particular, in transformers and in current-limiters for circuit breakers.

Figure 2:
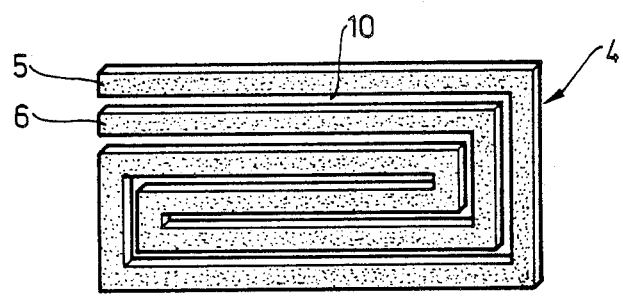
FIG. 2 is a diagrammatic perspective view of a flat coil in accordance with the invention.

FIG. 2 shows a rectangular plate 4 obtained by applying a uni-axial pressure of 4 tonnes per $cm^2$ to the above-defined oxide powder. This plate has the following dimensions:

24 mm $\times$ 12 mm $\times$ 0.6 mm.

After sintering for one hour in oxygen at 970° C., a tile is obtained having the dimensions of 20.5 mm $\times$ 10.2 mm $\times$ 0.5 mm. Making use of the fact that this material is sufficiently conductive at ambient temperature, it is possible to cut the plate 4 along a line 10 using the elctro-erosion technique.

This gives rise to a flat coil whose inlet and outlet are referenced 5 and 6 and which has practically no self-inductance. Hereagain, the element shown is a laboratory model. Such a coil could be used industrially in power electronics, in particular in a power switch.

Figure 3:
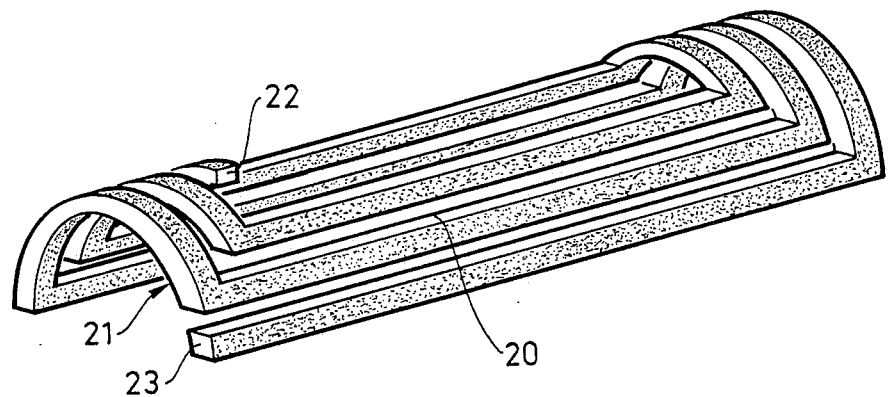
FIG. 3 is a diagrammatic fragmentary perspective view of an element in accordance with the invention forming a part of a dipole.
Figure 4:
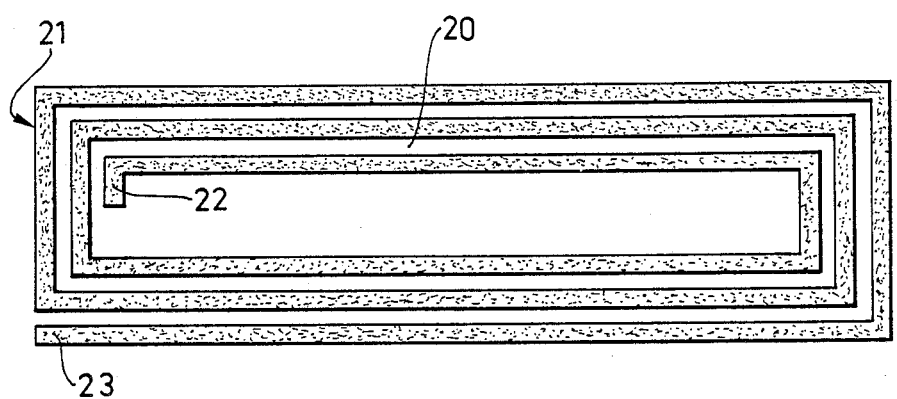
FIG. 4 is a developed plan view of the element shown in FIG. 3.

FIGS. 3 and 4 show one half 21 of a dipole obtained from a hollow cylinder sintered from the same material as the above coils. It is cut, e.g. using as diamond saw, along a plane including its axis in order to obtain two half cylinders. Each element 21 is machined by electro-erosion along the line 20 which can be seen more clearly in the developed view of FIG. 4. The inlet and the outlet of the coil are referenced 22 and 23.

The current flows in opposite directions in the two analogous elements of the dipole.

Such dipoles have industrial applications, in particular, as field windings for electrical machines.

Naturally the invention is not limited to the conductor shapes described above, nor to the machining methods mentioned. It applies tp all superconducting materials having ceramic characteristics.

We claim:

1. A solid element coil-like conductor solely of sintered superconducting oxide, having a high critical temperature, and constituting a self-supporting structure.

2. A conductor according to claim 1, wherein said solid element coil-like conductor is a cut hollow cylinder forming a solenoid.

3. A conductor according to claim 1, wherein said solid element coil-like conductor is a cut rectangular plate forming a flat coil.

4. A conductor according to claim 1, wherein said solid element, coil-like conductor comprises two hollow, cut half-cylinders forming two portions of a dipole.

5. A conductor according to claim 1, wherein said superconducting oxide is selected from compounds of the type: La Ba Cu O; La Sr Cu O; are Y Ba Cu O.

* * * * *